(12) United States Patent
Zu et al.

(10) Patent No.: US 6,879,494 B2
(45) Date of Patent: Apr. 12, 2005

(54) CIRCUIT PACKAGE FOR ELECTRONIC SYSTEMS

(75) Inventors: Longqiang L. Zu, Phoenix, AZ (US); Jennifer A. Hester, Avondale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/447,162

(22) Filed: May 27, 2003

(65) Prior Publication Data

US 2003/0206405 A1 Nov. 6, 2003

Related U.S. Application Data

(62) Division of application No. 09/605,524, filed on Jun. 27, 2000, now Pat. No. 6,594,153.

(51) Int. Cl.$^7$ .............................. H05K 7/10; H05K 7/12
(52) U.S. Cl. ..................... 361/768; 361/720; 361/760; 257/773; 257/775; 174/261; 174/262
(58) Field of Search ................................ 361/768, 760, 361/720, 746, 748; 257/775, 773; 174/51, 261–262, 266, 250

(56) References Cited

U.S. PATENT DOCUMENTS

| | | | |
|---|---|---|---|
| 5,155,302 A | 10/1992 | Nguyen | 174/88 R |
| 5,159,530 A | 10/1992 | Komoto | 361/386 |
| 5,249,098 A | 9/1993 | Rostoker et al. | 361/600 |
| 5,403,978 A | 4/1995 | Drabek et al. | 174/262 |
| 5,633,785 A | 5/1997 | Parker et al. | 361/766 |
| 5,712,768 A | 1/1998 | Werther | 361/767 |
| 5,936,843 A | 8/1999 | Ohshima et al. | 361/760 |
| 6,051,784 A | 4/2000 | Yoon | 174/52.3 |
| 6,055,151 A | 4/2000 | Tormey et al. | 361/313 |
| 6,072,211 A | 6/2000 | Miller et al. | 257/308 |
| 6,072,240 A | 6/2000 | Kimura et al. | 257/735 |
| 6,091,194 A | 7/2000 | Swirbel et al. | 313/498 |
| 6,184,477 B1 * | 2/2001 | Tanahashi | 174/261 |
| 6,225,687 B1 * | 5/2001 | Wood | 257/683 |

FOREIGN PATENT DOCUMENTS

JP  08-079071  3/1996  ............. H03L/7/18

OTHER PUBLICATIONS

Ott, Henry W., "Noise Reduction Techniques in Electronic Systems, 2nd Edition", *Copyright 1998 by AT&T Laboratories*, Published by John Wiley & Sons, Inc.,(1998).

* cited by examiner

*Primary Examiner*—Kamand Cuneo
*Assistant Examiner*—Hung S. Bui
(74) *Attorney, Agent, or Firm*—Schwegman, Lundberg, Woessner & Kluth, P.A.

(57) ABSTRACT

A circuit package has been described for routing long traces between an electronic circuit, such as a phase locked loop, and external circuit components. The traces are routed through two substrates. In each substrate, the traces are routed primarily on a layer adjacent to and between a pair ground planes located close to the traces. Degassing apertures are located to the side of the long traces to avoid interfering with the shielding provided by the grounds planes. The circuit package uses two power plated through holes and two ground plated through holes to reduce the noise on the power supply lines. The circuit package also separates the signal carrying plated through holes from the power plated through holes, which reduces noise on the long traces. Noise is further reduced on the long traces by using the ground plated through holes to shield the signal carrying plated through holes from noise generated at the power plated through holes.

14 Claims, 7 Drawing Sheets

CIRCUIT PACKAGE FOR ELECTRONIC SYSTEMS

This application is a divisional of U.S. patent application Ser. No. 09/605,524, filed Jun. 27, 2000, now issued as U.S. Pat. No. 6,594,153, which is herein incorporated by reference.

FIELD

This invention relates to circuit packages, and more particularly, to circuit packages capable of reducing noise in electronic systems.

BACKGROUND

Noise can interfere with the operation of electronic systems by corrupting the signals in the systems. In complex electronic systems, such as processor systems, design choices can increase the susceptibility of signals in the system to corruption by noise. For example, increasing the length of a power-carrying conductor increases the susceptibility of a power signal to noise corruption. Since the power signal is coupled from the power-carrying conductors through transistors, resistors, capacitors, and other electronic components, noise on the power signal can be coupled to the signal-carrying conductors. Noise coupled to the signal carrying conductors may in turn corrupt signals on the signal-carrying conductors. For example, if a signal-carrying conductor carries a clock signal, then noise coupled to the signal-carrying conductor can corrupt the clock signal and cause inconsistent operation of any systems synchronized to the clock signal. It is therefore desirable to design electronic packaging to reduce the likelihood of corrupting power carrying conductors with noise.

A number of techniques for reducing the effects of noise in electronic systems are described in Noise Reduction Techniques in Electronic Systems, 2nd Edition, by Henry W. Ott. For example, Ott describes electromagnetic shielding packages and grounding structures that can be used to reduce noise in electronic systems. Unfortunately, these shielding packages and grounding structures and the general principles that underlie their operation are difficult to apply to complex electronic systems. The difficulty in applying these general principles to a complex electronic system increases as the number of substrates in the system increases, as the number of conductive layers in the substrates increases, as the number of signal and power carrying conductors increases, and as the frequency of any system clocks increases. The problem becomes especially difficult when long, power-carrying conductors are coupled to components external to a die. Such a problem arises in phase-locked loop circuits used in processors to generate a system clock. These circuits are often coupled by a long conductor to an external power supply filter located on a second level substrate.

For these and other reasons there is a need for the present invention.

DESCRIPTION

A circuit package and a number of substrates included in the circuit package are described. In the following description, for purposes of explanation, numerous specific details are set forth in order to provide a thorough understanding of the present invention. It will be evident, however, to one skilled in the art that the present invention may be practiced without these specific details. In other instances well known manufacturing processes and methods have not been described in order to not obscure the present invention.

Noise can be reduced in signal-carrying conductors in electronic packages by the positioning of packaging elements, such as power planes, ground planes, and plated through holes. Noise can also be reduced by dividing the routing of the signal-carrying conductors in a particular way between the substrates that make up the package.

Figure 1:
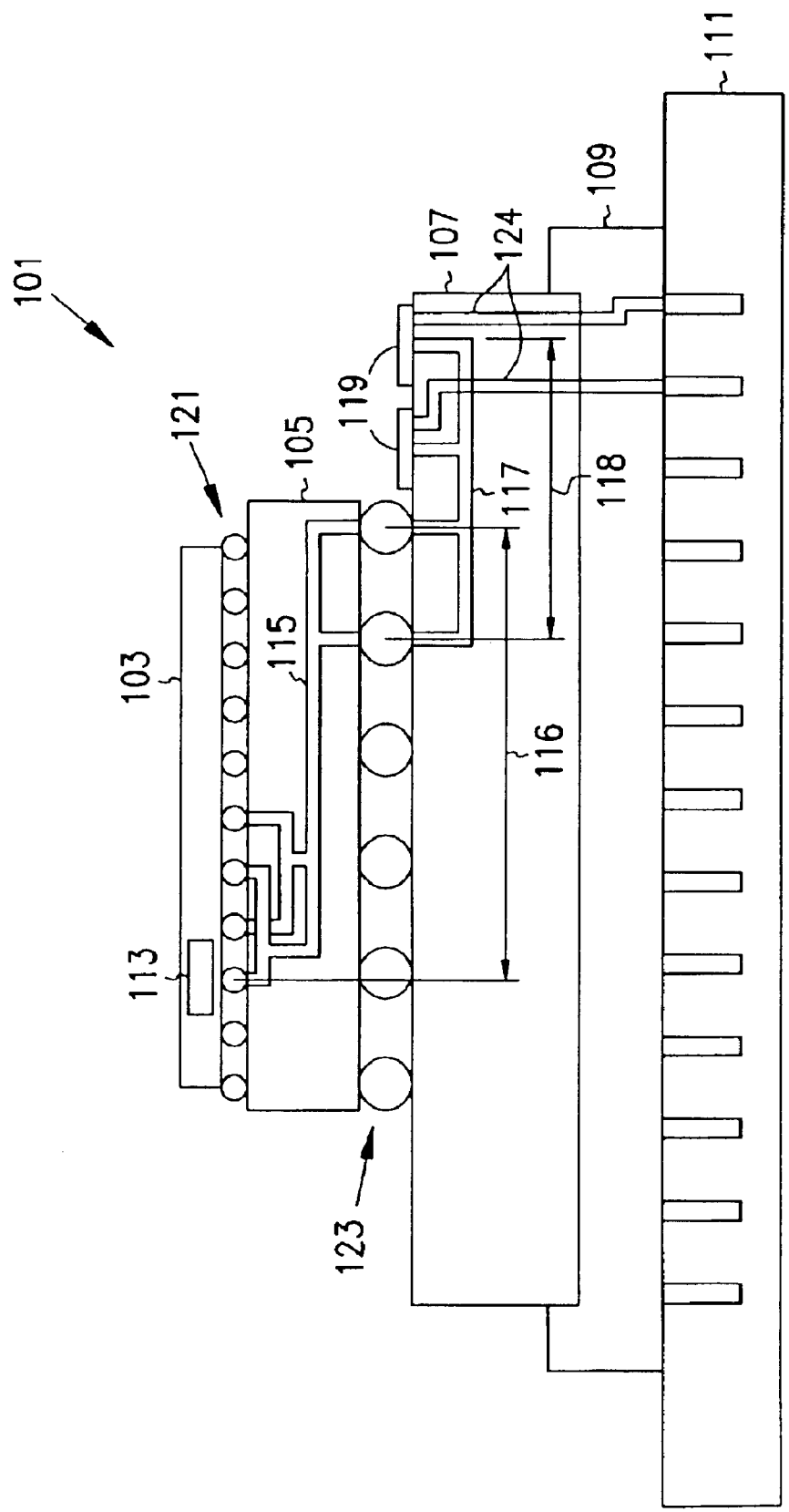
FIG. 1 is a cross-sectional side view of some embodiments of a circuit package according to the present invention.

FIG. 1 depicts one aspect of circuit package 101 according to the present invention. In general, the circuit package 101 includes die 103, first substrate 105, second substrate 107, socket 109, board 111, phase-locked loop (PLL) 113, first trace 115 having first trace length 116, second trace 117 having second trace length 118, and circuit elements 119. Die 103, including PLL 113, is electrically coupled to first substrate 105 through controlled collapsed chip connection bumps (C4 bumps) 121, and first substrate 105 is electrically coupled to second substrate 107 through ball grid array (BGA) 123. Second substrate 107 fits in socket 109, which is mounted on board 111.

Signals, such as power supply signals 124, are provided to circuit elements 119 and are coupled to die 103 and phase-locked loop 113 by a conductive path which includes second trace 117, ball grid array 123, first trace 115, and controlled collapsed chip connection bumps (C4 bumps) 121. In one embodiment, circuit elements 119 comprise a filter, such as a power supply filter, including one or more capacitors and one or more inductors.

Die 103 is generally fabricated from a semiconductor, such as silicon, germanium, or gallium arsenide and includes an electronic circuit, such as a processor, an integrated circuit, such as an application specific integrated circuit (ASIC), or a memory circuit. The electronic circuit included in die 103 includes a circuit, such as phase locked loop (PLL) 113, which is coupled to components, such as circuit elements 119, which are external to die 103, Processors suitable for use in connection with the present invention include microprocessors, reduced instruction set computers (RISC), and digital signal processors (DSPs). ASICs suitable for use in connection with the present invention include telecommunication ASICs, automotive ASICs, and aerospace ASICs. Memory circuits suitable for use in connection with the present invention include random access memory (RAM), static random access memory (SRAM), dynamic access memory (DRAM), erasable programmable read only memory (EPROM), and electrically erasable programmable read only memory (EEPROM). The present invention is not limited to use in connection with the above described processors, ASICs, and memory circuits, but may be used in connection with any electronic circuits that require packaging on a plurality of substrates and routing of signals through the plurality of substrates.

First substrate 105 provides a platform for mounting die 103. Preferably die 103 is coupled to first substrate 105 using "flip-chip" mounting. In "flip-chip" mounting, controlled collapsed chip connection bumps (C4 bumps) 121 provide a conductive path for coupling electronic signals between die 103 and first substrate 105, without using bond wires. However, wire-bonding may also be used to couple signals between die 103 and first substrate 105.

Figure 2:
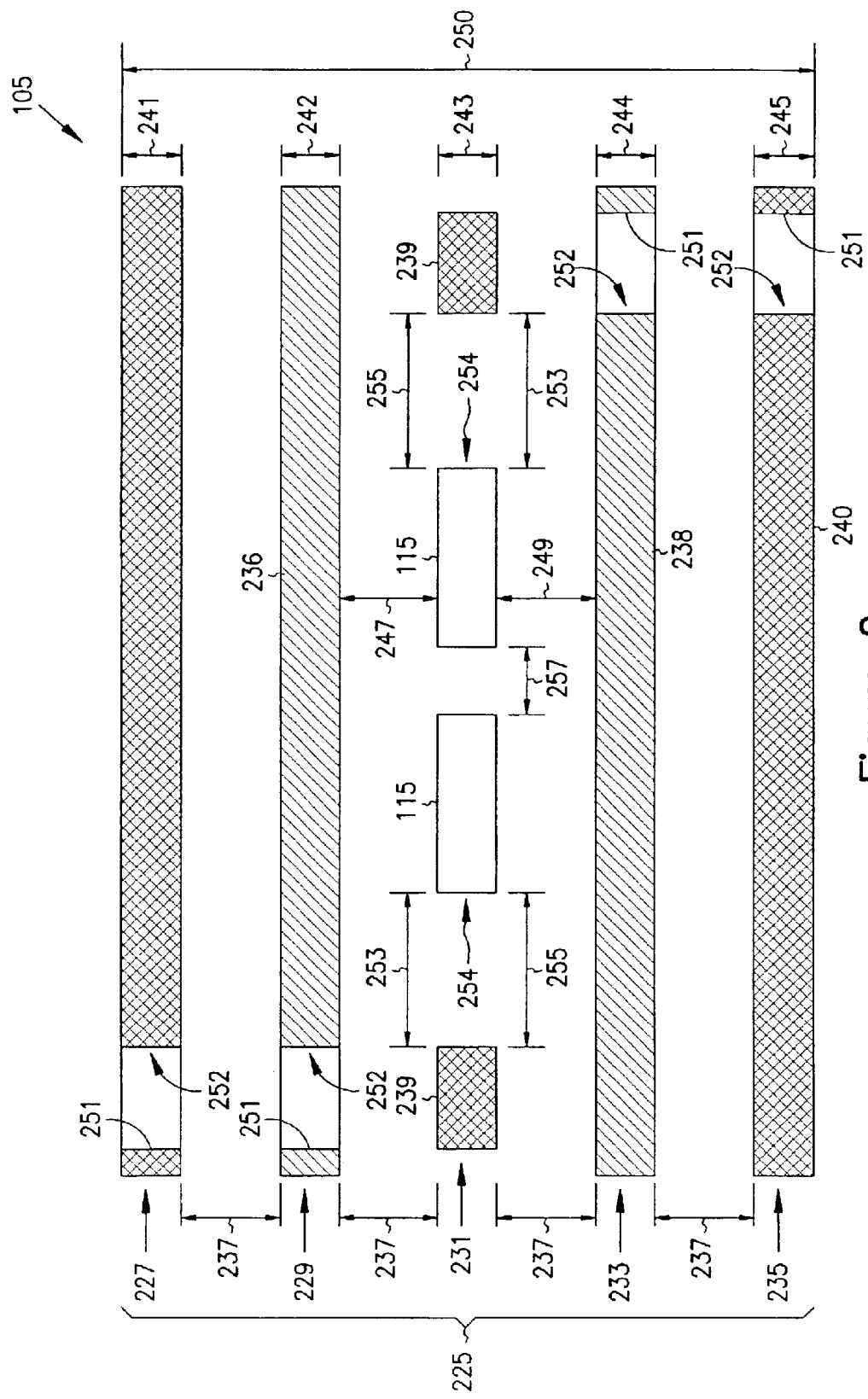
FIG. 2 is a cross-sectional side view of some embodiments of a first substrate according to the present invention.

FIG. 2 is a cross-sectional side view of some embodiments of first substrate 105 according to the present invention. In one embodiment, first substrate 105 has five conductive layers 225 including first layer 227, second layer 229, third layer 231, fourth layer 233, and fifth layer 235. Preferably, each of the five conductive layers is separated from neighboring layers by a dielectric, such as a glass epoxy (not shown) having a thickness 237 of about 33 micrometers. In one embodiment, first layer 227 includes a power plane, second layer 229 includes ground plane 236, third layer 231 includes first trace 115 and power plane 239, fourth layer 233 includes ground plane 238, and fifth layer 235 includes one or more lands 240. Fifth layer 235 has an exemplary metallization thickness 245 of about 24 micrometers, and each of the layers 227, 229, 231, and 233 has an exemplary metallization thickness 242, 243, 244, and 245, respectively, of about 17 micrometers. A phase-locked loop (PLL) filter may include one or more conductive traces. A conductive trace is formed from a conductive material, usually a metal, such as copper, aluminum, or gold, and is capable of carrying an electronic signal. As shown in FIG. 2, first trace 115 comprises a pair of conductive traces located between ground planes 236 and 238.

First substrate 105 includes features that reduce the probability of noise being coupled to first trace 115. To shield first trace 115 from electromagnetic noise, first trace 115, which in one embodiment comprises two parallel traces, is placed between the two ground planes 236 and 238. In one embodiment, distance 247 is about 33 micrometers and distance 249 is about 33 micrometers. To further shield first trace 115 from electromagnetic noise, degassing apertures 251 are located to the side of first trace 115. In one embodiment, each edge 252 of each degassing aperture 251 is located at a lateral distance 253 of about 136 micrometers from an outside edge 254 of first trace 115. To reduce noise coupling between power plane 239 and first trace 115, the lateral distance 255 between first trace 115 and power plane 239 is kept large compared to the distance between third layer 231 and fourth layer 233. In one embodiment, lateral distance 255 is about 136 micrometers. Finally, for first trace 115 fabricated as a pair of traces, to increase the coupling between the pair of traces, and therefore, to reduce the loop inductance of the two traces, separation distance 257 in an exemplary embodiment is about 50 micrometers.

Figure 3:
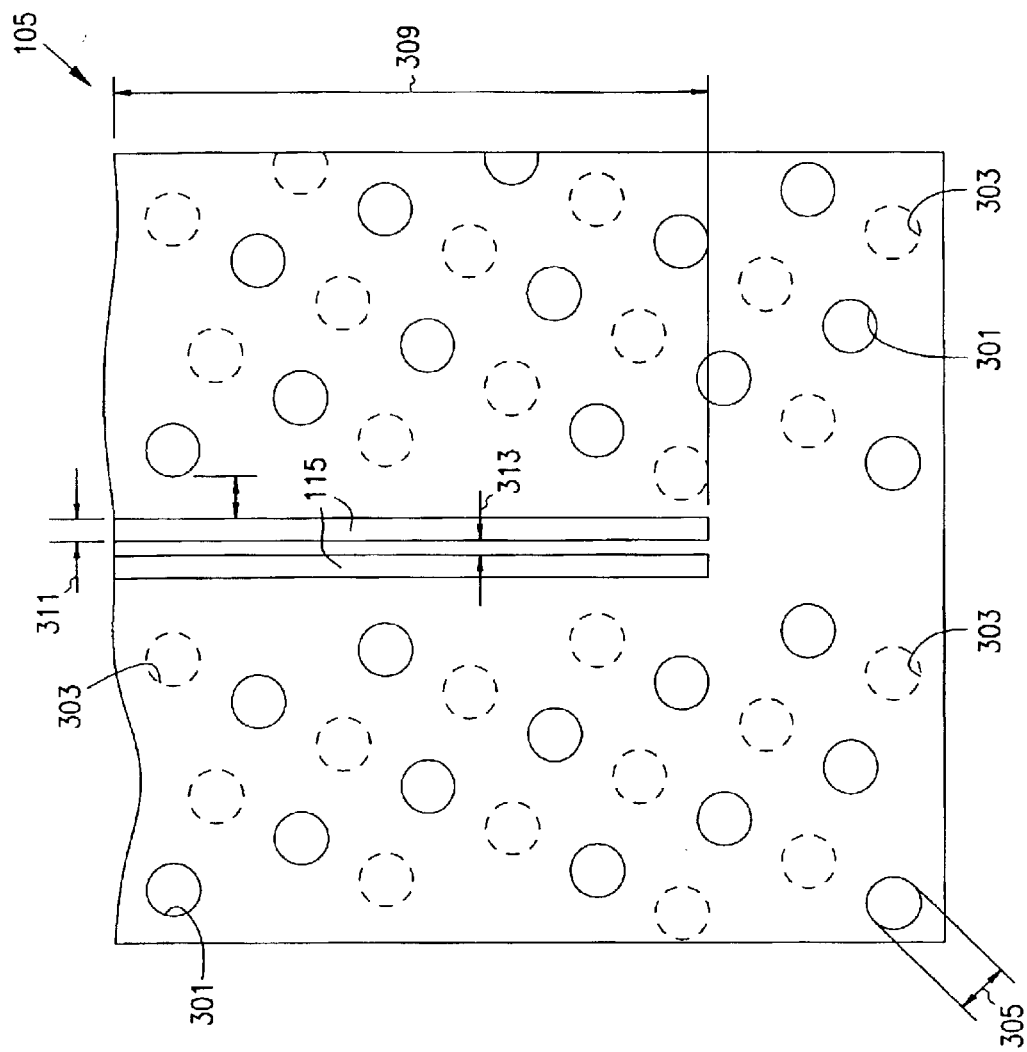
FIG. 3 is a top view of some embodiments of a circuit package, including one or more degassing apertures not shown in FIG. 2, according to the present invention.

FIG. 3 is a top view illustrating some embodiments of the location of one or more degassing apertures 301 and 303 which are not shown in FIG. 2. Referring to FIG. 2 and FIG. 3, first substrate 105 includes one or more degassing apertures 301 located on first layer 227 and second layer 229. Still referring to FIG. 2 and FIG. 3, first substrate 105 also includes one or more degassing apertures 303 located on fourth layer 233 and fifth layer 235. The degassing apertures provide a path for gases to exit first substrate 105 during the manufacturing of first substrate 105. Providing a path for gases to exit first substrate 105 reduces the formation of bubbles in the dielectric layers of first substrate 105. In one embodiment, each of the degassing apertures 301 and 303 have a circular shape and each of the degassing apertures 301 and 303 has an exemplary diameter 305 of approximately 250 micrometers.

First trace 115, as shown in FIG. 3, comprises a pair of traces and provides a conductive path for one or more electrical signals. First trace 115 has trace length 309, trace width 311, and separation distance 313. In one embodiment, trace length 309 has an exemplary value of about 25 millimeters, trace width 311 has an exemplary value of about 111 micrometers, and separation distance 313 has an exemplary value of about 50 micrometers. Referring again to FIG. 2 and FIG. 3, degassing apertures 301 and 303 are positioned to each side of first trace 115. Positioning degassing apertures 301 and 303 to each side of trace 115 provides first trace 115 with uninterrupted shielding from electromagnetic radiation originating above second layer 229 or below fourth layer 233. Simulations have shown that by locating the degassing apertures to each side of first trace 115 rather than directly above first trace 115, the noise coupling coefficient between trace 115 and the first layer 227 is reduced by about 200 times.

Figure 4:
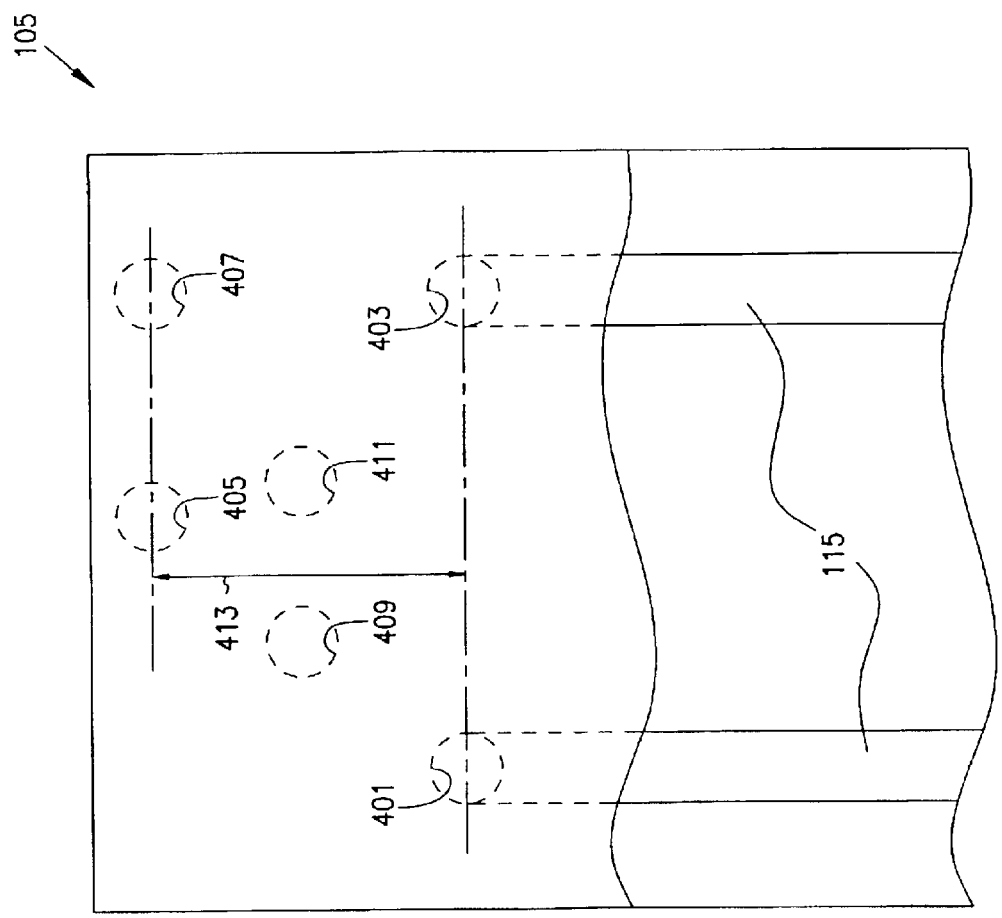
FIG. 4 is a top view of some embodiments of a circuit package, including a number of plated through holes not shown in FIG. 2, according to the present invention.
Figure 5:
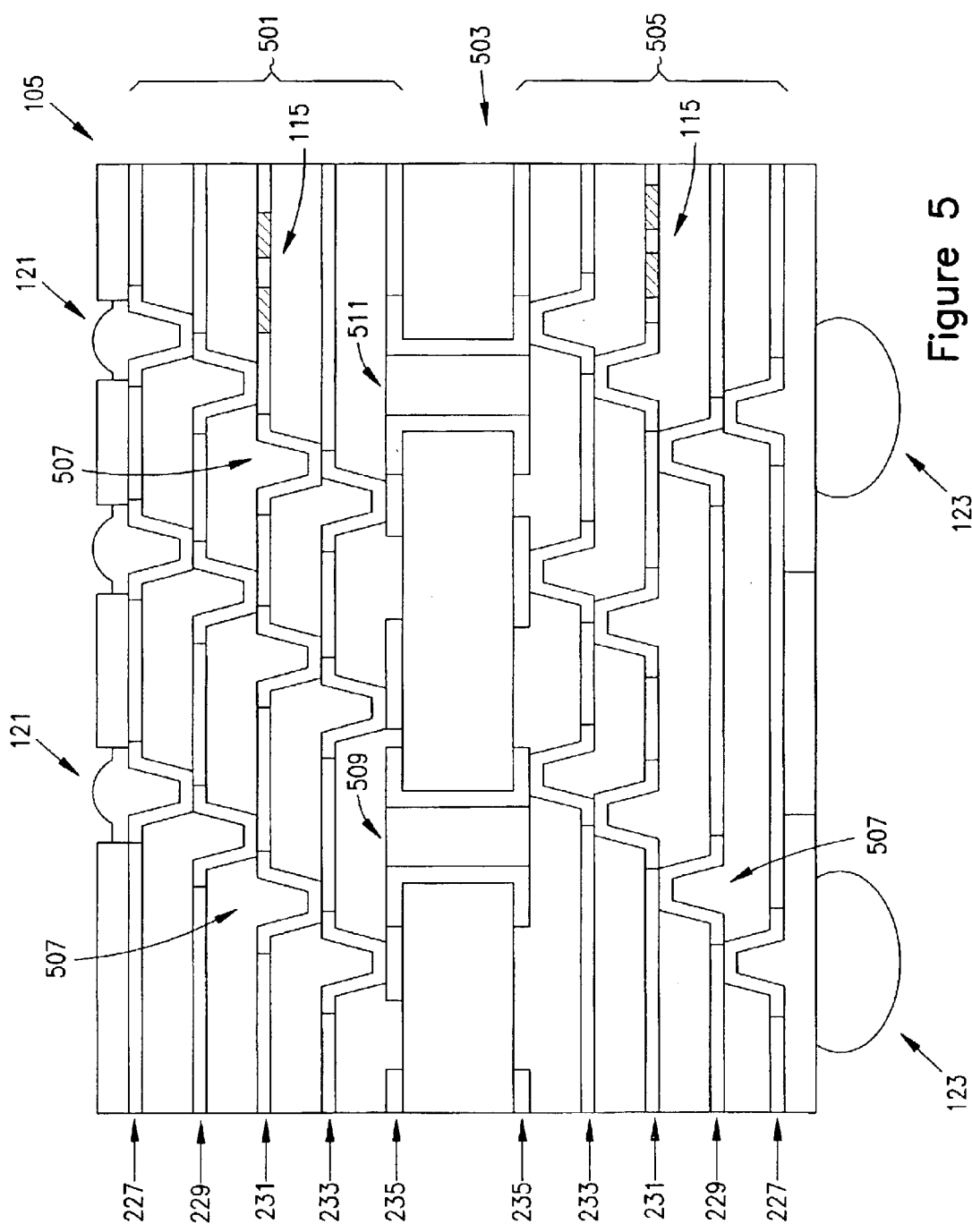
FIG. 5 is a cross-sectional side view of an alternate embodiment of a first substrate according to the present invention.

FIG. 4 is a top view of first substrate 105 showing plated through holes (PTHs) 401, 403, 405, 407, 409, and 411 (not shown in FIG. 3) and a cutaway top view of substrate 105 showing first trace 115. A plated through hole provides a conductive path for routing a signal across a dielectric layer, such as a substrate core layer. A plated through hole is formed in a dielectric layer by forming a vertical conductive path through the dielectric layer. Methods of fabricating plated through holes are known to those skilled in the art. FIG. 5, which is described below, includes illustrations of exemplary embodiments of plated through holes suitable for use in connection with the present invention.

To reduce noise coupling between a power signal routed through plated through holes 405 and 407 and a signal on first trace 115 routed through plated through holes 401 and 403, separation distance 413 between plated through holes 405 and 407, on the one hand, and plated through holes 401 and 403, on the other hand, is made large. To further reduce noise coupling between a power signal routed through plated through holes 405 and 407 and a signal on first trace 115 routed through plated through holes 401 and 403, plated through holes 409 and 411 are positioned between plated through holes 405 and 407, on the one hand, and plated through holes 401 and 403, on the other. In one embodiment, plated through hole 409 is located between plated through holes 405 and 407, on the one hand, and plated through holes 401 and 403, on the other hand by locating plated through hole 409 along a line connecting plated through hole 405 to plated through hole 401. Similarly, in one embodiment, plated through hole 411 is located between plated through holes 405 and 407, on the one hand, and plated through holes 401 and 403, on the other hand, by locating plated through hole 411 along a line connecting plated through hole 405 to plated through hole 403. Those skilled in the art will recognize that other arrangements of the plated through holes 409 and 411 place plated through holes 409 and 411 between plated through holes 405 and 407, on the one hand, and plated through holes 401 and 403, on the other hand. Arranging the plated through holes as described, shields signals on first trace 115 routed through holes 401 from noise generated at plated through holes 405 and 407.

Also, as shown in FIG. 4, two plated through holes 405 and 407 are used to couple power from the front side buildup layers to the backside buildup layers of first substrate 105, and two plated through holes 409 and 411 are used to couple ground from the front side buildup layers to the backside buildup layers of first substrate 105. When plated through holes 405 and 407 and plated through holes 409 and 411 are coupled to die 103, noise coupled to die 103 is reduced when compared with noise coupled to die 103 for a power distribution system using a single power plated through hole and a single ground plated through hole. Simulations have shown for circuit package 101, which is shown in FIG. 1, that by using two plated through holes for power and two plated through holes for ground, rather than one plated through one for power and one plated through hole for ground, a noise spike that was found by the inventors to occur in phase locked loop 113 at one gigahertz was reduced by about 10 decibels.

Referring again to FIG. 1, second substrate 107 provides a platform for circuit elements 119 and a structure for coupling first substrate 105 to socket 109. In one embodiment, first substrate 105 is coupled to second substrate 107 using ball grid array (BGA) technology. Ball grid array 123 provides a conductive path for coupling electronic signals between first substrate 105 and second substrate 107. The present invention is not limited to ball grid array coupling, and any method capable of coupling signals between second substrate 107 and first substrate 105 is suitable for use in connection with the present invention.

FIG. 5 is a cross-sectional side view of an alternate embodiment of the first substrate 105 according to the present invention. As shown in FIG. 5, first substrate 105 comprises five conductive layers 501 formed above a core 503 and five conductive layers 505 formed below core 503. Core 503 is preferably fabricated from a dielectric. In one embodiment, the five conductive layers 501 formed above core 503 comprise the layers 227, 229, 231, 233, and 235 shown in FIG. 2, and the five conductive layers 503 formed below core 503 correspond to the layers 227, 229, 231, 233, and 235 shown in FIG. 2. First trace 115 is shown in FIG. 5 as being routed on the layer 231 formed above core 503 and the layer 231 formed below the core 503. By confining the routing of first trace 115 to the layers 231, signals carried on the first trace 115 benefit from the noise protection provided by the ground planes of layers 229 and 233. Substrate 105, shown in FIG. 5, also illustrates the coupling of signals between controlled collapse chip connection bumps (C4 bumps) 121 and ball grid array (BGA) 123. The signals are coupled from the C4 bumps 121 to the BGA 123 by one or more vias 507 and plated through holes 509 and 511. Methods for fabricating the plated through holes 509 and 511 and methods for fabricating the one or more vias 507 are known in the art. Signals capable of being coupled between the C4 bumps 121 and the BGA 123 by the vias and plated through holes described above include power signals, ground signals, and information signals.

Figure 6:
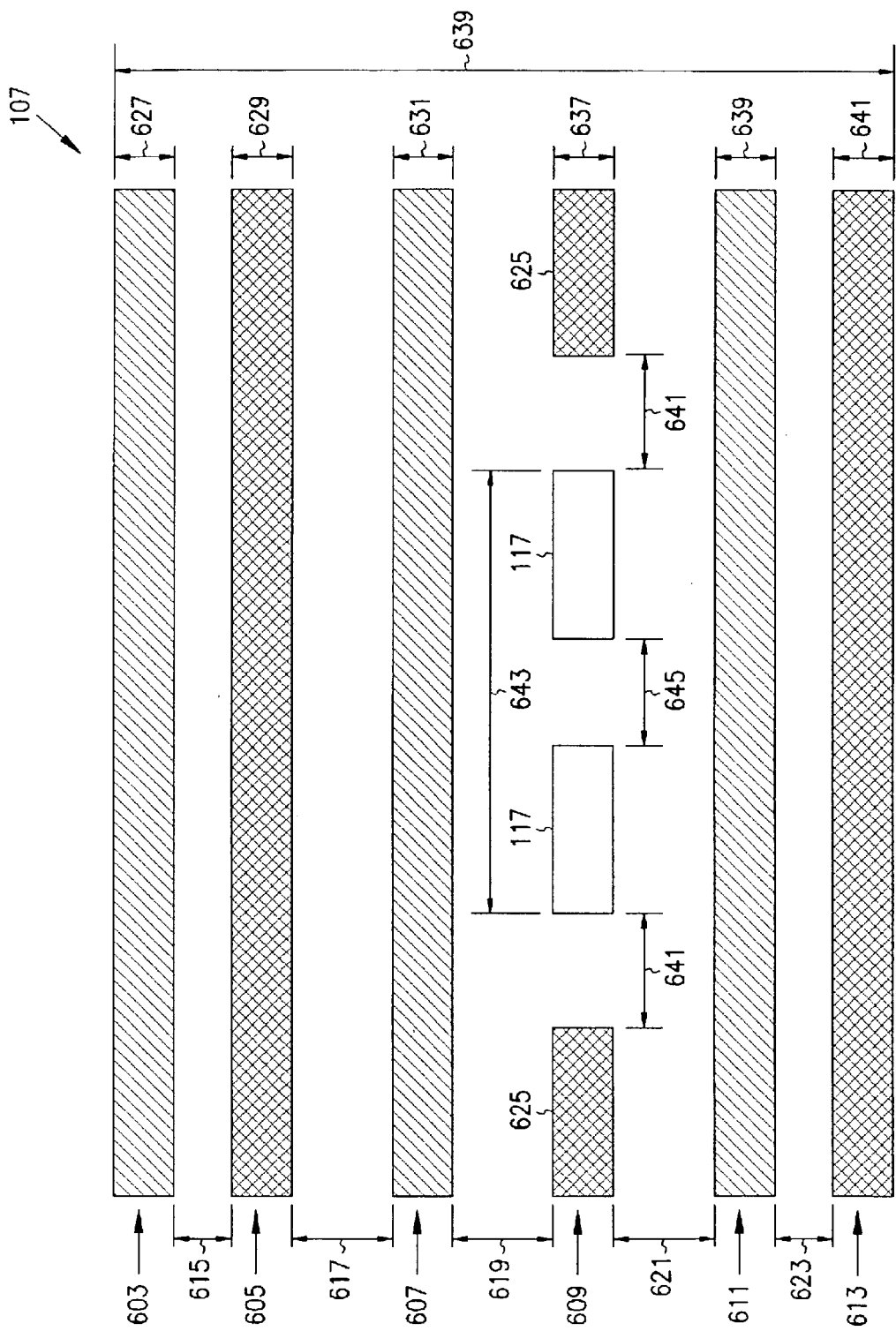
FIG. 6 is a cross-sectional side view of some embodiments of a second substrate according to the present invention.

FIG. 6 is a cross-sectional illustration of some embodiments of second substrate 107 according to the present invention. Preferably, second substrate 107 has six conductive layers including first layer 603, second layer 605, third layer 607, fourth layer 609, fifth layer 611, and sixth layer 613. Preferably, each of the six conductive layers is separated from neighboring layers by a dielectric (not shown) having a dielectric constant of about 4.5. Dielectric materials suitable for use in connection with the present invention include FR4 or FR5. The separation distance between layers may vary. In one embodiment, the distance 615 between first layer 603 and second layer 605 is about 0.004 inches, the distance 617 between second layer 605 and third layer 607 is about 0.0115 inches, the distance 619 between third layer 607 and fourth layer 609 is about 0.0116 inches, the distance 621 between fourth layer 609 and fifth layer 611 is about 0.0115 inches, and the distance 623 between fifth layer 611 and sixth layer 613 is about 0.004 inches.

Each layer of second substrate 107 has a particular function. In one embodiment, first layer 603 is a ground plane and provides a ball grid array interface, second layer 605 is a power plane, third layer 607 is a ground plane, fourth layer 609 includes second trace 117 and power plane 625, fifth layer 611 is a ground plane, and sixth layer 613 is a power plane. Second trace 117 may include one or more conductive traces. As shown in FIG. 6, second trace 117 is a pair of parallel conductive traces routed on fourth layer 609 between the ground planes formed on third layer 607 and fifth layer 611.

Referring again to FIG. 1, second trace 117 and first trace 115, when connected together, form a continuous conductive trace that connects phase locked loop 113 to circuit elements 119. To reduce noise coupled to first trace 115 and second trace 117, first trace length 116 is made greater than second trace length 118. In one embodiment, first trace length 116 is about 86% of the sum of first trace length 116 and second trace length 118. Second trace length 118 is about 14% of the sum of first trace length 116 and second trace length 118. A noise coupling coefficient exists that characterizes the coupling of noise between first trace 115 and the surrounding noise sources and between second trace 117 and the surrounding noise sources. Simulations have shown a reduction in the noise coupling coefficient of about 180 for first trace length 116 being about 86% of the sum of first trace length 116 and second trace length 118 as compared to first trace length 116 being about 14% of the sum of first trace length 116 and second trace length 118. This is because first trace 115 routed on substrate 105 has better shielding than second trace 117 routed on substrate 107.

Each of the six layers may have a different metallization thickness. In one embodiment, metallization thickness 627 of first layer 603 is about 0.0035 inches, metallization thickness 629 of second layer 605 is about 0.0014 inches, metallization thickness 631 of third layer 607 is about 0.0014 inches, metallization thickness 637 of fourth layer 609 is about 0.0014 inches, metallization thickness 639 of fifth layer 611 is about 0.0014 inches, and metallization thickness 641 of sixth layer 613 is about 0.0035 inches.

Second substrate 107 includes features that reduce the probability of noise being coupled to second trace 117. To reduce the probability of electromagnetic noise being coupled to second trace 117, distance 619 between the third layer 607 ground plane and the second trace 117 and the distance 621 between the fifth layer 611 ground plane and the second trace 117 are kept small. In one embodiment, distance 619 is about 0.0116 inches and distance 621 is about 0.0115 inches. To reduce noise coupling between power plane 625 and second trace 117, lateral distance 641 between second trace 117 and power plane 625 is kept large compared to width 643 of second trace 117. In one embodiment, lateral distance 641 is greater than about 0.020 inches. To increase coupling between parallel conductors when second trace 117 is a pair of conductors, separation distance 645 between the parallel conductors is made as small as the design rules allow. In one embodiment, separation distance 645 is about 0.005 inches. The tight coupling of the second trace 117, which in one embodiment comprises two traces, reduces the loop inductance of the two traces and further reduces noise.

Figure 7:
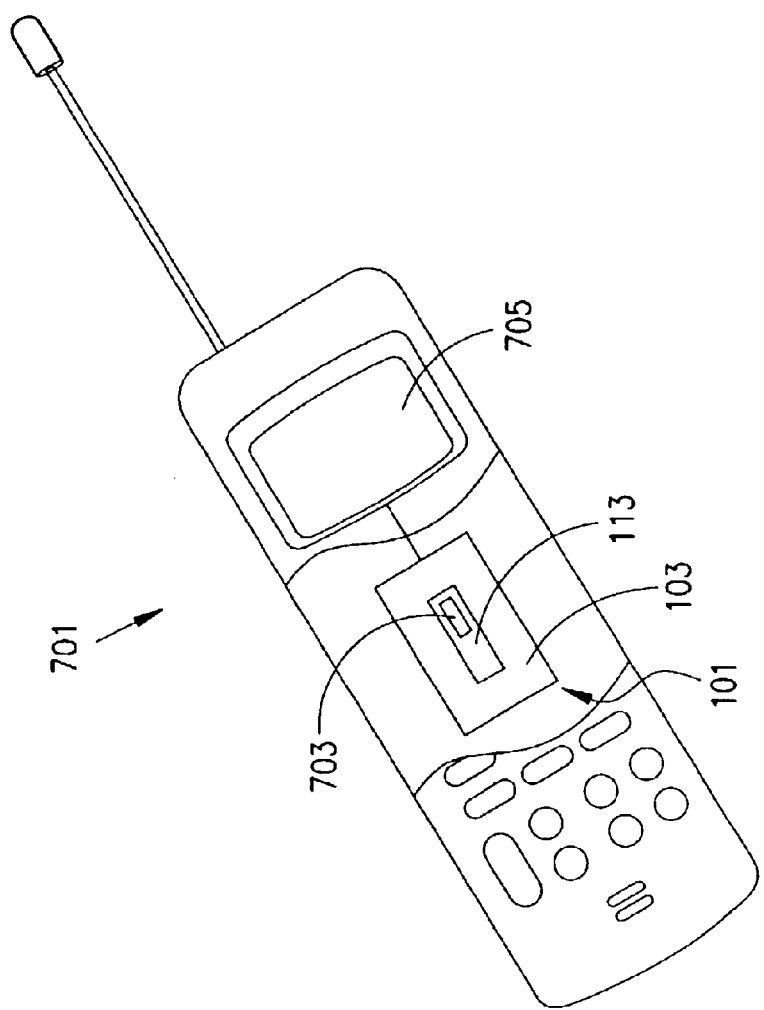
FIG. 7 is an illustration of some embodiments of a communication device, including a circuit package, according to the present invention.

FIG. 7 is an illustration of computerized device 701 suitable for use in connection with the present invention. Computerized device 701 includes circuit package 101 having a processor 703 fabricated on die 103 and display 705 coupled to processor 703. In one embodiment, processor 703 is a microprocessor including a phase locked loop capable of operating at a high frequency, such as two gigahertz. Display 705 is any display capable of being coupled to a microprocessor. While display 705 may be a cathode ray tube display, in other embodiments, display 705 may be a liquid crystal display. Computerized device 701 is not limited to a particular type of computerized device. In one embodiment, computerized device 701 is a hand-held video display device. In an alternate embodiment, computerized device 701 is a portable communication device.

A circuit package has been described for routing long traces between an electronic circuit, such as a phase locked loop, and external circuit components. In one embodiment, the traces are routed through two substrates. By routing the traces primarily through the substrates on a layer adjacent to ground planes located close to the traces, the noise coupled to the traces from noisy power planes is significantly reduced. Also, by positioning degassing apertures to the sides of the long traces, shielding is improved and electromagnetic noise is significantly reduced at the traces. By using two plated through holes for power and two plated through holes for ground, and by separating the signal carrying plated through holes from the power plated through holes, high frequency noise is reduced on the long traces. Finally, by using the plated through holes for ground to shield the signal carrying plated through holes from plated through holes for power, high frequency noise is further reduced on the long traces.

Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

What is claimed is:

1. A substrate comprising:
   five conductive layers, including a third layer, a first ground plane, and a second ground plane, wherein a trace is routed on the third layer, and the third layer is located between the first ground plane and the second ground plane; and
   one or more substantially circular degassing apertures through two or more layers of the five conductive layers other than the third layer, wherein selected ones of the one or more degassing apertures are located lateral distances of at least 200 micrometers from edges of the trace, and wherein the degassing apertures are located to sides of the trace in an irregular pattern that substantially avoids overlying the signal trace.

2. The substrate of claim 1, wherein the five conductive layers further comprise a first layer, and a fifth layer, and wherein the one or more degassing apertures are formed through the first layer, the first ground plane, the second ground plane, and the fifth layer.

3. The substrate of claim 2, wherein selected ones of the one or more degassing apertures formed through the first layer are substantially aligned with one of the one or more degassing apertures formed through the first ground plane.

4. The substrate of claim 1, wherein one or more first degassing apertures are formed through the first ground plane, and one or more second degassing apertures are formed through the second ground plane.

5. The substrate of claim 1, wherein selected ones of the one or more degassing apertures have a diameter of about 250 micrometers.

6. The substrate of claim 1, wherein the substrate comprises a first pair of plated through holes for coupling power between the first ground plane and the second ground plane, and a second pair of plated through holes for coupling ground between the first ground plane and the second ground plane.

7. The substrate of claim 6, wherein the substrate further comprises a third pair of plated through holes coupled to the trace, and wherein the second pair of plated through holes is located closer to the third pair of plated through holes than to the first pair of plated through holes.

8. The substrate of claim 1, wherein the trace is laterally separated from a power plane by a distance of at least about 200 micrometers.

9. The substrate of claim 1, wherein the trace has a length of about 25 millimeters.

10. The substrate of claim 1, wherein the trace has a width of about 111 micrometers.

11. The substrate of claim 1, wherein the trace comprises a pair of traces having a separation distance of about 50 micrometers.

12. A substrate comprising:
   a first conductive trace;
   a first ground plane located above the first conductive trace;
   a second ground plane located below the first conductive trace, wherein the first ground plane and the second ground plane are to shield the first conductive trace from electromagnetic noise;
   a first pattern of first degassing apertures located in the first ground plane, wherein the first degassing apertures are located to one or more sides of the first trace by lateral distances between the one or more sides of the first trace and inside edges of the first degassing apertures, and wherein the first pattern is irregular in that it substantially excludes degassing apertures located directly above the first trace; and
   a second pattern of second degassing apertures located in the second ground plane, wherein the second degassing apertures are located to the one or more sides of the first trace by lateral distances between the one or more sides of the first trace and inside edge of the second degassing apertures, and wherein the second pattern is irregular in that it substantially excludes degassing apertures located directly below the first trace.

13. The substrate of claim 12, wherein the first trace comprises two parallel traces located a separation distance apart to increase coupling between the two parallel traces.

14. The substrate of claim 12, further comprising:
   a first conductive layer located above the first ground plane;
   a second conductive layer located below the second ground plane;
   one or more third degassing apertures located in the first conductive layer; and
   one or more fourth degassing apertures located in the second conductive layer.

* * * * *

UNITED STATES PATENT AND TRADEMARK OFFICE
CERTIFICATE OF CORRECTION

PATENT NO. : 6,879,494 B2
DATED : April 12, 2005
INVENTOR(S) : Zu et al.

Page 1 of 1

It is certified that error appears in the above-identified patent and that said Letters Patent is hereby corrected as shown below:

Title page,
Item [56], References Cited, OTHER PUBLICATIONS, delete "(1998)" and insert -- (1988) --, therefor.

Column 8,
Line 49, delete "edge" and insert -- edges --, therefor.

Signed and Sealed this

Twenty-third Day of August, 2005

JON W. DUDAS
*Director of the United States Patent and Trademark Office*